(12) United States Patent
Stowe et al.

(10) Patent No.: US 9,638,813 B2
(45) Date of Patent: May 2, 2017

(54) THERMAL NEUTRON DETECTOR AND GAMMA-RAY SPECTROMETER UTILIZING A SINGLE MATERIAL

(71) Applicants: Ashley Stowe, Knoxville, TN (US); Arnold Burger, Nashville, TN (US); Eric Lukosi, Knoxville, TN (US)

(72) Inventors: Ashley Stowe, Knoxville, TN (US); Arnold Burger, Nashville, TN (US); Eric Lukosi, Knoxville, TN (US)

(73) Assignees: Consolidated Nuclear Security, LLC, Oak Ridge, TN (US); Fisk University, Nashville, TN (US); University of Tennessee Research Foundation, Knoxville, TN (US)

(*) Notice: Subject to any disclaimer, the term of this patent is extended or adjusted under 35 U.S.C. 154(b) by 0 days.

(21) Appl. No.: 14/871,162

(22) Filed: Sep. 30, 2015

(65) Prior Publication Data

US 2016/0146953 A1  May 26, 2016

Related U.S. Application Data

(63) Continuation-in-part of application No. 13/658,591, filed on Oct. 23, 2012, now Pat. No. 9,334,581.

(51) Int. Cl.
| | |
|---|---|
| *G01T 1/20* | (2006.01) |
| *G01T 3/08* | (2006.01) |
| *G01T 1/36* | (2006.01) |
| *C30B 11/06* | (2006.01) |

(Continued)

(52) U.S. Cl.
CPC .............. *G01T 1/361* (2013.01); *C30B 11/06* (2013.01); *C30B 11/12* (2013.01); *C30B 29/46* (2013.01); *G01T 1/362* (2013.01); *G01T 3/08* (2013.01)

(58) Field of Classification Search
None
See application file for complete search history.

(56) References Cited

U.S. PATENT DOCUMENTS 7,687,780 B2   3/2010   Bell et al.

OTHER PUBLICATIONS

O. Balachninaite, L. Petraviciute, M. Maciulevicius, V. Sirutkaitis, L. Isaenko, S. Lobanov, A. Yelisseyev, J.-J. Zondy; Absorptance and scattering losses measurements of the mid-infrared nonlinear crystals LiInSe2 and LiInS2 in the IR range.; ISSN 1392-2114 ULTRAGARSAS Nr.3(60). 2006.

(Continued)

*Primary Examiner* — Edwin Gunberg
(74) *Attorney, Agent, or Firm* — Clements Bernard Walker PLLC; Christopher L. Bernard; Lawrence A. Baratta, Jr.

(57) ABSTRACT

A combined thermal neutron detector and gamma-ray spectrometer system, including: a detection medium including a lithium chalcopyrite crystal operable for detecting thermal neutrons in a semiconductor mode and gamma-rays in a scintillator mode; and a photodetector coupled to the detection medium also operable for detecting the gamma rays. Optionally, the detection medium includes a $^6$LiInSe$_2$ crystal. Optionally, the detection medium comprises a compound formed by the process of: melting a Group III element; adding a Group I element to the melted Group III element at a rate that allows the Group I and Group III elements to react thereby providing a single phase I-III compound; and adding a Group VI element to the single phase I-III compound and heating; wherein the Group I element includes lithium.

21 Claims, 5 Drawing Sheets

(51) Int. Cl.
*C30B 11/12* (2006.01)
*C30B 29/46* (2006.01)

(56) References Cited

OTHER PUBLICATIONS

L. Isaenko, A. Yelisseyev, S. Lobanov, A. Titov, V. Petrov, J.-J. Zondy, P. Krinitsin, A. Merkulov, V. Vedenyapin, J. Smironova; "Growth and properties of LiGaX2 (X-S, Se, Te) single crystals for nonlinear optical applications in the mid-IR"; Crys. Res. Technol. 38, No. 3-5, 379-387 (2003) / DO1 10.1002/crat.200310047.; 2003 WILEY-VCH Verlag GmbH & Co. KGaA, Wenheim 0232-1300/03/3-504-0379.

L. Isaenko, P. Krinitsin, V. Vedenyapin, A. Yelisseyev, A. Merkulov, J.-J. Xondy, and V. Petrov; "LiGaTe2: A New Highly Nonlinear Chalcopyrite Optical Crystal for the Mid-IR"; Crystal Growth & Design, vol. 5. No. 4 1325-1329, 2005.

THERMAL NEUTRON DETECTOR AND GAMMA-RAY SPECTROMETER UTILIZING A SINGLE MATERIAL

CROSS-REFERENCE TO RELATED APPLICATION

The present patent application/patent is a continuation-in-part (CIP) of co-pending U.S. patent application Ser. No. 13/658,591, filed on Oct. 23, 2012, and entitled "METHODS FOR SYNTHESIZING SEMICONDUCTOR QUALITY CHALCOPYRITE CRYSTALS FOR NONLINEAR OPTICAL AND RADIATION DETECTION APPLICATIONS AND THE LIKE," the contents of which are incorporated in full by reference herein.

STATEMENT REGARDING FEDERALLY SPONSORED RESEARCH OR DEVELOPMENT

The U.S. Government has rights to the present disclosure pursuant to Contract No. DE-NA0001942 between the U.S. Department of Energy and Consolidated Nuclear Security, LLC.

FIELD OF THE DISCLOSURE

The present disclosure relates generally to a thermal neutron detector and gamma-ray spectrometer utilizing a single material. More specifically, the present disclosure relates to a thermal neutron detector and gamma-ray spectrometer utilizing a semiconductor-quality chalcopyrite crystal or the like.

BACKGROUND OF THE DISCLOSURE

A worldwide helium shortage has developed in recent years due to the limited supply of $^3$He and the increasing demand for neutron detection materials for scientific and security applications. As a result, research into alternatives to gas detectors ($^3$He or $^{10}$BF$_3$) and scintillation detectors (cerium-doped lithium glass) has expanded. It is highly desirable to develop a solid-state detector for neutron detection. In much the same way as solid-state CZT detectors have revolutionized gamma-ray detection, a solid-state neutron detector would offer the significant advantages of portability, sensitivity, simplicity, and low cost. A neutron absorber (e.g., $^6$Li or $^{10}$B) must be used along with a charge collector in such a device. To date, most lithium-containing solid-state neutron detectors have utilized a lithium conversion layer in conjunction with a silicon diode detector. To obtain a useable thickness of lithium to stop neutrons efficiently, deep holes are etched in the silicon, and a lithium (or boron)-containing material is conformally deposited in the holes. If, however, the neutron absorber is within the charge generating/collecting device, which is the semiconductor, each thermal neutron impinging on the detector crystal has a high probability of reacting with the absorber atom inside the solid, generating high-energy charged particles that, in turn, use their energies to create electron-hole pairs in the semiconductor. This is the same phenomenon that occurs in coated semiconductor detectors; however, in the Li-containing compound semiconductors, the charged particles are created within the charge collection device, and the entire Q-value of the reaction is available for charge generation. In the coated detectors, however, only one of the two charged particles can enter the detector, and the alpha particle must have lost a random fraction of its energy traversing the absorber layer. Ternary $A^IB^{III}C^{VI}_2$ semiconductors with a chalcopyrite crystal structure would meet these criteria if $^6$Li is included, in accordance with the present invention.

The primary competition to such ternary $A^IB^{III}C^{VI}_2$ semiconductors is from CLYC, a Cs$_2$LiYCl$_6$:Ce scintillator that detects both thermal neutrons (via the $^6$Li(n,α) $^3$He reaction) and gamma-rays, with an energy resolution of 3.38%. While the theoretical limit for energy resolution with scintillators is 2%, wide-band gap semiconductors, such as CdZnTe, have been demonstrated to be producible in large quantities, with 2% energy resolution at 662 keV. Furthermore, wide-band gap semiconductors may have improved photopeak efficiency as compared to scintillators, due to high-Z loading. For instance, LiInSe has a density of 4.49 g/cm$^3$ (as compared to 3.67 g/cm$^3$ for NaI or 3.31 g/cm$^3$ for CLYC, a scintillating thermal neutron detector) and is constituted of elements with Z values of 3 (Li), 49 (In), and 34 (Se). Clearly, making a detector sensitive to slow neutrons by including Li means that it will be somewhat less efficient for sensing energetic gamma rays, but provides an opportunity to sense both types of radiation when properly designing the detectors, in accordance with the present invention.

BRIEF SUMMARY OF THE DISCLOSURE

In various exemplary embodiments, the present disclosure provides a novel room-temperature compound semiconductor detector crystal that contains a neutron absorbing element within the compound that is also sensitive to gamma-rays in a single handheld package. Via selective shielding of each of the two detectors, the package combines high gamma-to-neutron discrimination, low cost, low power, insensitivity to magnetic fields, and a compact design. The detector package contains the detector crystal, bias voltage, amplification, and a multichannel analyzer for data collection, as well as Lithium ion batteries for power. The detector package is coupled with a smartphone interface or the like for data processing and output. Detection is possible in both semiconductor and scintillation modes, with a SiPM or avalanche photo-diode being used when scintillation is employed. Separation of the gamma and neutron signal is possible with typical pulse space discrimination (PSD) techniques due to the large Q-value (4.78 MeV) of the $^6$Li (n,α) reaction.

In one exemplary embodiment, the present disclosure provides a combined thermal neutron detector and gamma-ray spectrometer system, including: a detection medium including a lithium chalcopyrite crystal operable for detecting thermal neutrons in a semiconductor mode and gamma-rays in a scintillator mode; and a photodetector coupled to the detection medium also operable for detecting the gamma rays. Optionally, the detection medium includes a $^6$LiInSe$_2$ crystal. The photodetector is a high-band gap photodetector. Optionally, the photodetector is one of a Si Avalanche Photodiode (APD) and a Si Photomultiplier (SiPM). The system also includes a bias voltage source coupled to the detection medium. The system further includes a plurality of contacts coupled to the detection medium. The system still further includes an amplification system. The system still further includes a data collection and processing device. Optionally, the detection medium is a I-III-VI$_2$ compound formed by the process of: melting a Group III element; adding a Group I element to the melted Group III element at a rate that allows the Group I and Group III elements to react thereby providing a single phase I-III compound; and adding a Group VI element to the single phase I-III compound and heating; wherein the Group I element includes lithium.

In another exemplary embodiment, the present disclosure provides a combined thermal neutron detector and gamma-ray spectrometer method, comprising: providing a detection medium including a lithium chalcopyrite crystal operable for detecting thermal neutrons in a semiconductor mode and gamma-rays in a scintillator mode; and providing a photodetector coupled to the detection medium also operable for detecting the gamma rays. The detection medium includes a $^6LiInSe_2$ crystal. The photodetector is a high-band gap photodetector. Optionally, the photodetector is one of a Si Avalanche Photodiode (APD) and a Si Photomultiplier (SiPM). The method also includes providing a bias voltage source coupled to the detection medium. The method further includes providing a plurality of contacts coupled to the detection medium. The method still further includes providing an amplification system. The method still further includes providing a data collection and processing device. Optionally, the detection medium is a I-III-VI$_2$ compound formed by the process of: melting a Group III element; adding a Group I element to the melted Group III element at a rate that allows the Group I and Group III elements to react thereby providing a single phase I-III compound; and adding a Group VI element to the single phase compound and heating; wherein the Group I element includes lithium.

In a further exemplary embodiment, the present disclosure provides a thermal neutron detector and gamma-ray spectrometer wherein an electrical contact is coupled adjacent to or fabricated on the front crystal surface (e.g., by radio frequency sputtering) in a grid or mesh pattern (e.g., by photolithography) with predetermined areas exposed, thereby allowing slow neutrons to be collected in the initial 5 mm (the thermal neutron absorption depth) and the gamma rays to pass through the predetermined exposed areas deeper into the bulk crystalline detection medium for current generation and detection. The grid or mesh pattern may be any suitable pattern, provided that gaps are formed, thereby allowing the neutrons to directly contact the font crystal surface and penetrate into the crystal. These gaps may have any surface area, which may or may not be consistent.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
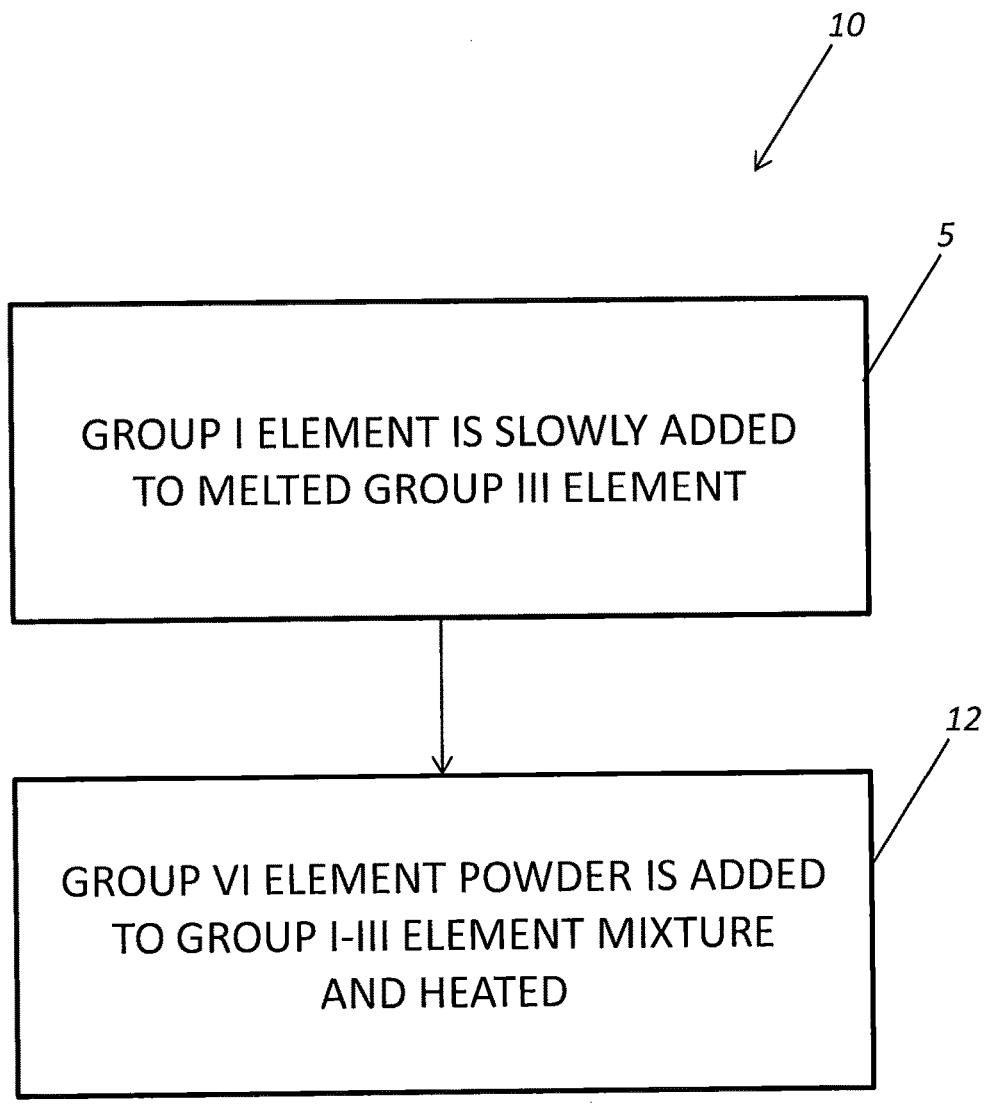
FIG. 1 is a flowchart illustrating one exemplary embodiment of the method for synthesizing I-III-ZVI$_2$ compounds of the present disclosure, specifically utilizing a heating process.

Related to U.S. Pat. No. 7,687,780 (Bell et al.), the detecting element includes a compound having the composition I-III-VI$_2$ or II-IV-V$_2$, where the "I" component is from column 1A or 1B of the periodic table, the "II" component is from column 2B of the periodic table, the "III" component is from column 3A of the periodic table, the "IV" component is from column 4A of the periodic table, the "V" component is from column 5A of the periodic table, and the "VI" component is from column 6A of the periodic table. A more concise manner of description is that the crystal is formed from elements in the group of 1A-3A-6A, 1B-3A-6A, or 2B-4A-5A of the periodic table. An example from group 1A-3A-6A is lithium-gallium-selenium. An example from group 1B-3A-6A is copper-gallium-selenium. An example from group 2B-4A-5A is cadmium-germanium-antimony. Crystals formed from groups 1B-3A-6A and 2B-4A-5A are chalcopyrites. The detecting element detects ionizing electromagnetic radiation by generating a signal proportional to the energy deposited in the element, and detects neutrons by virtue of the ionizing electromagnetic radiation emitted by one or more constituent materials subsequent to capture. The detector may contain more than one neutron sensitive element.

The detecting system generally includes a semiconductor crystal onto which conducting electrodes are deposited on opposing surfaces of the crystal. The semiconductor material may be intrinsic material or doped to produce intrinsic material. Intrinsic material, when referring to semiconductors, refers to a semiconductor material in which the majority and minority charge carriers in the material are balanced and the material does not display either negative (n-) or positive (p-) type conductivity. Doping is the process of introducing small amounts of impurities (typically in the amount of parts per million (ppm)) for the purpose of altering the electrical properties of the material to force a desired density of positive and negative charge carriers. The electrical contacts may be ohmic, or may be Schottky. An ohmic contact is a metal semiconductor contact with very low resistance independent of the polarity of the applied voltage. A Schottky contact is a metal semiconductor contact used to form a potential barrier. The resulting detecting element forms a p-n, or p-i-n diode, or simply a bulk semiconducting material.

In a preferred embodiment, a voltage is applied between the electrodes by a suitable means, such as a battery. A resistor is provided in line between one of the electrodes and the battery. Any signal generated in response to radiation is extracted through a junction between the crystal and the resistor. If the detecting element is simply bulk semiconducting material, then the polarity of the voltage with respect to the resistor is of no consequence. Although the resistor connected between the negative terminal of the battery and the crystal is contemplated, the resistor may also be connected between the positive terminal of the battery and the crystal with the signal taken from the junction between the resistor and the crystal. If the crystal is realized as a diode (p-n, p-i-n, or Schottky), then the connection must be such that the diode is reverse biased by the battery.

When the crystal is exposed to ionizing electromagnetic radiation, electron-hole pairs are created in the bulk of the material. These charges are separated by the applied voltage and the resulting charge pulse is sensed as a current pulse or a voltage pulse. The amplitude of the charge pulse is proportional to the energy deposited in the crystal by the radiation. In this mode, the crystal realizes a detector of alpha, beta, gamma, and x-ray radiation, in addition to cosmic rays.

In one arrangement, the crystal may be fabricated with one element that reacts with neutrons and subsequently emits ionizing electromagnetic radiation. The crystal then also serves to detect neutrons. For example, if the "I" element is silver (Ag), an element from column 1B of the periodic table, then exposure to neutrons results in transmutation of the silver nuclei to radioisotopes with short half-lives. These isotopes decay by the emission of beta particles (electrons), which create ionization in the detector just as would radiation originating outside the detecting element. Analysis of the spectrum of pulse amplitudes and the temporal behavior of the count rate yields a signature of the presence of neutrons.

In another arrangement, if the "I" element is lithium, an element from column 1A of the periodic table, then exposure to neutrons results in the exothermic reaction $^6Li(n,\alpha)^3H$. The energetic triton and alpha particles liberate charge as they decelerate, ultimately depositing their entire energy in the crystal. Analysis of the resulting spectrum of pulse amplitudes yields a signature of the presence of neutrons.

In a further arrangement, if the "III" (3A) element of the crystal is indium (In), behavior similar to that described for silver is observed. In a still further arrangement, more than one element may be neutron sensitive. For example, if both silver and indium are used, then multiple half-lives are observed in the count rate, and spectra of beta particles characteristic of both elements are observed in the pulse height spectrum. Analysis of such data can give information on the spectral characteristics of the incident neutron flux.

In operation, the semiconductor radiation detecting apparatus works in the following manner. Means are provided to convert current or charge pulses to a digital value. The electrical charge signal generated in response to radiation passes from the junction through a capacitor to a charge integrating pre-amplifier whose output signal, in turn, is directed to a shaping amplifier. The shaping amplifier produces an approximately Gaussian shaped pulse. The pulse is directed to an analog-to-digital converter (ADC), which translates the analog voltage developed by the shaping amplifier into a digital value. The digital values from the converter are directed to a processor and display. The processor records the number of times each value occurs during a measurement. This accumulates a histogram of the magnitudes of the pulses produced by the incident radiation. The processor compares these values to known values and provides an indication of the incident radiation based on the comparison. The use of the amplifiers, converter, and processor to condition signals and create an indication of the incident radiation is well known to those of ordinary skill in the art and does not require detailed explanation.

In an alternate embodiment, the pre-amplifier simply provides gain without integration and the shaping amplifier is replaced by a voltage comparator and gated integrator. The voltage comparator triggers the gated integrator to integrate the voltage pulse from the pre-amplifier. The gated integrator signals the ADC to perform a conversion when the integration period is complete. The processor and display perform the same functions as described above.

In another alternate embodiment, a battery supplies bias to the crystal. The charge generated by incident radiation in the crystal is separated by the potential developed by the virtual ground at the inverting terminal of the operational amplifier, and the resulting current pulse is forced through a feedback resistor. In this manner, the current pulse is converted to a voltage pulse and is then directed to the pre-amplifier.

These crystals are useful as radiation detectors, and as semiconductors, for the following reasons. Carrier mobility in the range of 500-10,000 $cm^2/V\text{-}s$ has been reported and band gaps between 1.2 and 2.7 eV have been produced. These values are comparable to or better than those of germanium and indicate that performance at room temperature should exceed that of CZT. In addition, some of the constituent materials have high neutron absorption cross sections, conferring simultaneous sensitivity to ionizing electromagnetic radiation and neutrons.

There are a number of advantages to using chalcopyrites. There is a ready availability of high purity, oriented, crack free, single chalcopyrite crystals produced for use in optical applications. These crystals are used in infrared nonlinear optical equipment to effect second harmonic generation or optical parametric oscillation. The finished materials have improved properties that should continue to improve as a result of research and development spurred by the interest of the military in using chalcopyrites in high powered lasers. Chalcopyrites have physical properties that permit their use as semiconductor radiation detectors at room temperature. As such, they operate according to the same physics as do silicon, CZT, and mercuric iodide. However, they differ from these materials in that the average atomic number is much larger than silicon, making them useful at higher energies than silicon. They can be grown in large, crack free single crystal boules (unlike CZT and mercuric iodide). Further, the neutron absorber density is large and average Z number is low compared to CZT, for example, such that high neutron detection efficiencies can be realized using thin crystals, thereby minimizing gamma interference in the chalcopyrite crystals. They also are an improvement over mercuric iodide in that the use of mercuric iodide is limited to applications in which the temperature does not exceed 80 degrees Celsius, while chalcopyrites can withstand temperatures up to several hundred degrees Celsius.

Without limitation, it may be advantageous to deposit more than two electrodes onto the crystal to control the shape of the internal electric field. In another example, sandwiching the crystal between spring loaded contacts enables the application of a voltage without the deposition of electrodes. In yet another example, the pre-amplifier, shaping amplifier, and ADC may be replaced by a charge-to-digital converter.

Figure 2:
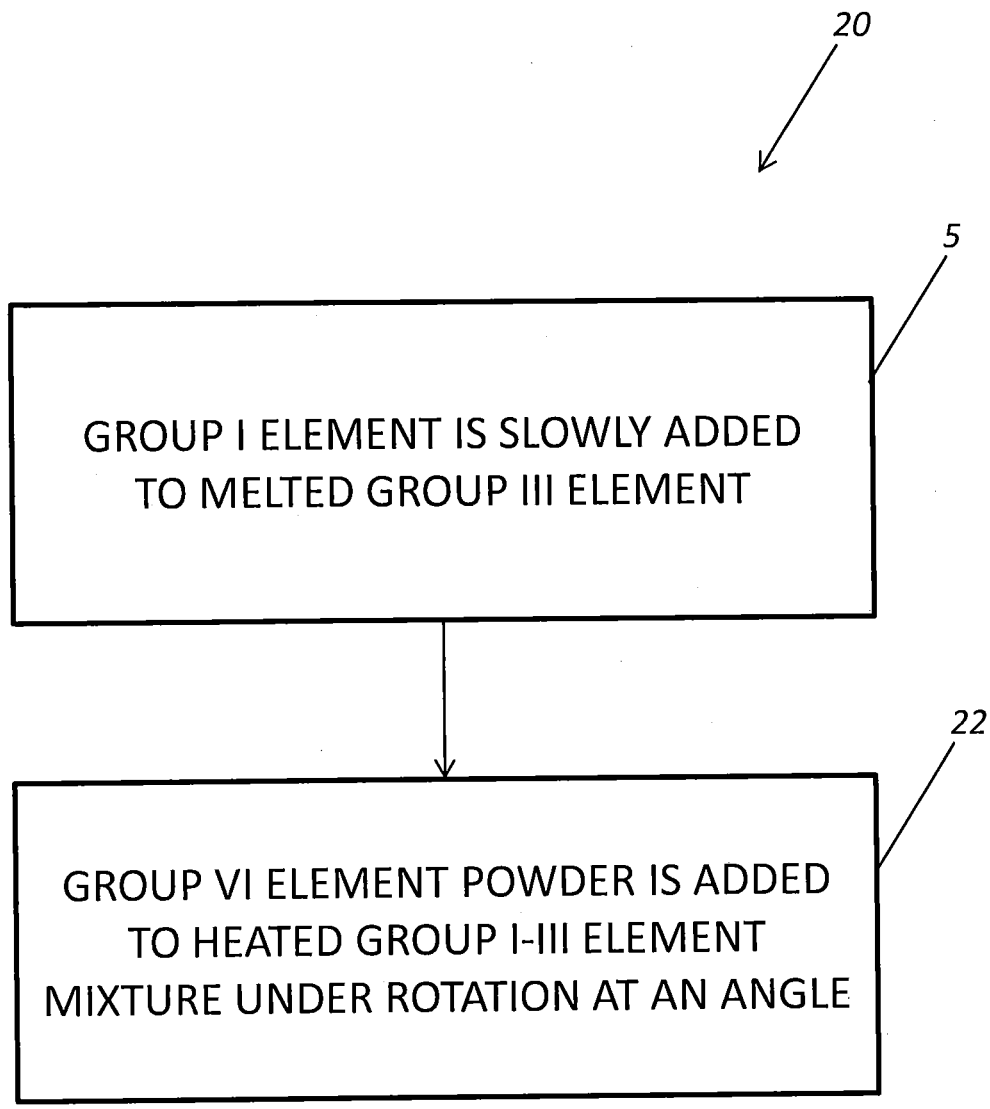
FIG. 2 is a flowchart illustrating another exemplary embodiment of the method for synthesizing I-III-VI$_2$ compounds of the present disclosure, specifically utilizing a mixing process.
Figure 3:
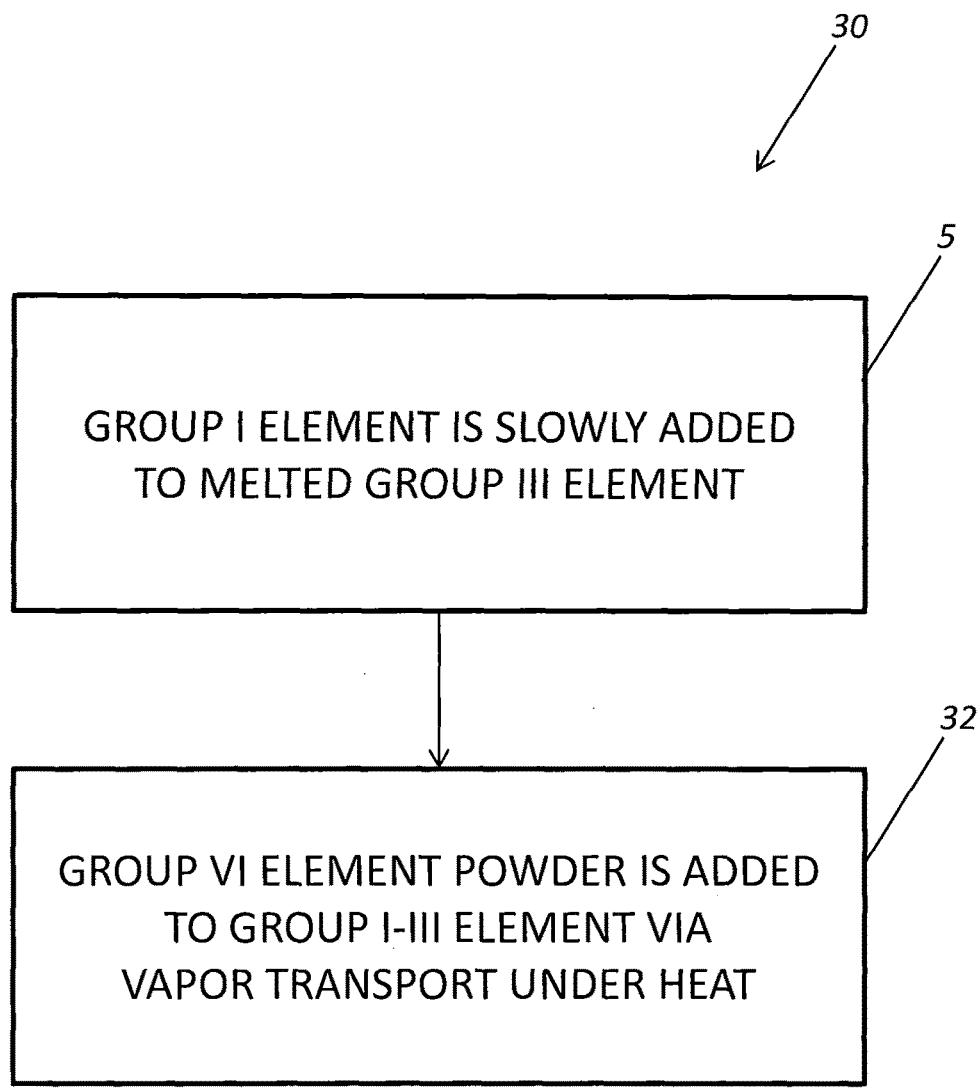
FIG. 3 is a flowchart illustrating a further exemplary embodiment of the method for synthesizing I-III-VI$_2$ compounds of the present disclosure, specifically utilizing a vapor transport process.

In view of the above, the present disclosure involves separating I-III-VI$_2$ synthesis from the constituent elements into two distinct steps, and three associated embodiments are contemplated. The highest quality elemental starting materials are required to achieve successful synthesis of I-III-VI$_2$ compounds. Group I elements typically have the lowest purities as starting materials. Referring to FIGS. 1-3, in all exemplary embodiments, the most reactive element (Group I) is reacted with the Group III element, forming a binary alloy with equal stoichiometry 5. The Group III element is melted in a crucible under inert atmosphere for increased safety and purity. The Group I element is then slowly added to the melt, allowing the small amount of Group I element to react before another addition. This process minimizes overheating of the reaction, which causes additional alloy stoichiometries to form in the melt. The result is a highly crystalline, single phase I-III material. Two moles of a Group VI element are then added to the I-III compound at elevated temperature to form the chalcopyrite I-III-VI$_2$. The method by which the Group VI element is added is different in each of the three exemplary embodiments.

Referring specifically to FIG. 1, in the first exemplary embodiment 10, the Group VI elemental powder is added directly to the I-III alloy and heated to 700-900 degrees C. (depending on the group VI element) in a crucible 12. The reaction is allowed to proceed to completion and then cooled. Because the I-III compound is formed in an initial reaction step, the stoichiometry is defined as one mole for each element. Addition of the Group VI element for the final I-III-VI reaction has lower overall stoichiometric variability throughout the charge.

Referring specifically to FIG. 2, in the second exemplary embodiment 20, the addition of the Group VI element into a single crucible is as with the first exemplary embodiment; however, the constituents are mixed at elevated temperature with constant crucible rotation at an angle 22, for example about 20 degrees. Rotation further promotes mixing during the synthesis to reduce phase variability.

Referring specifically to FIG. 3, the third exemplary embodiment 30 involves vapor transport of the Group VI element 32. The previously prepared I-III compound is placed in one well of a crucible, while the Group VI element is placed in an adjacent well. As the mixture is heated to 700-900 degrees C., the Group VI element slowly vaporizes and is transported through thermal currents to the melted group I-III well. The reaction then occurs to form I-III-VI$_2$. Vapor transport further slows the reaction to minimize overheating and promote a single phase synthetic charge.

It should be noted that the methods of the present invention are not limited to the synthesis of semiconductor materials. Doping with an activator (e.g., Group IV element) may be performed to create a scintillator material, for example.

Figure 4:
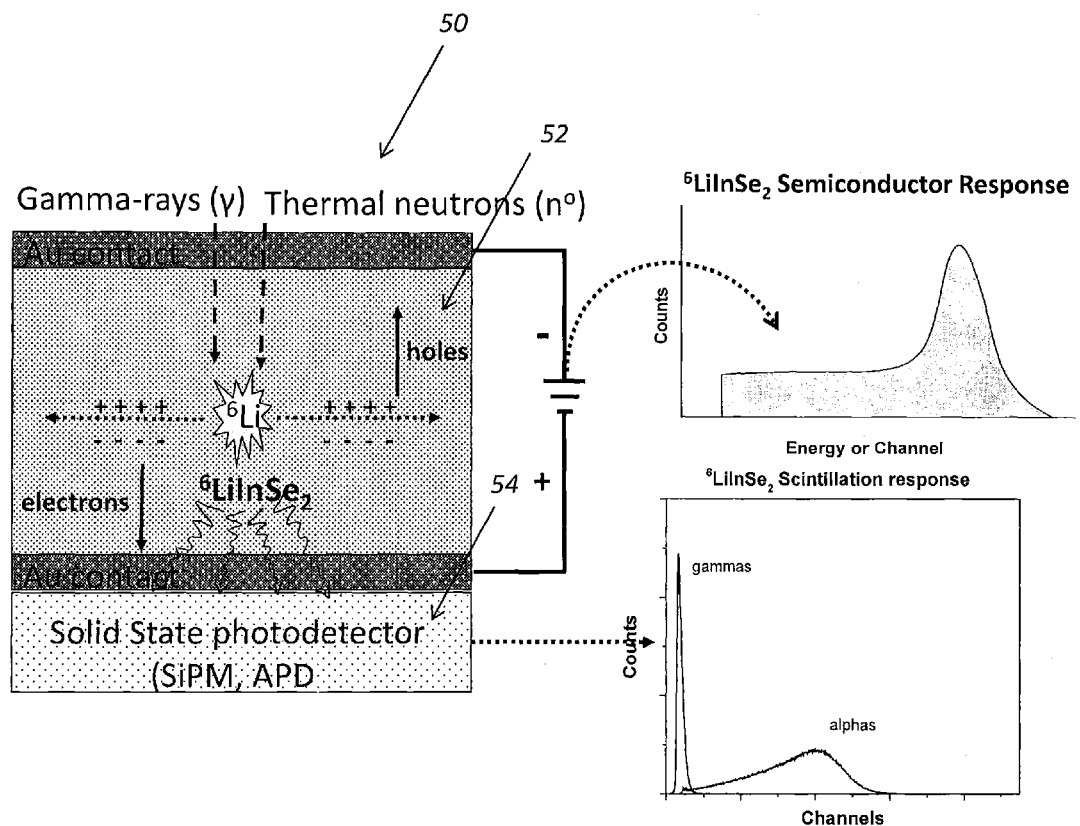
FIG. 4 is a schematic diagram illustrating one exemplary embodiment of the thermal neutron detector and gamma-ray spectrometer of the present disclosure.

Referring now specifically to FIG. 4, in one exemplary embodiment of the thermal neutron detector and gamma-ray spectrometer 50 of the present disclosure, the active detection media is a Li-containing chalcopyrite 52, such as a $^6$LiInSe$_2$ crystal. The single material 52 detects both thermal neutrons and gamma-rays in one of two possible modes. The single material 52 is a semiconductor and a scintillator. $^6$LiInSe$_2$ is a single crystal semiconductor in which thermal neutrons (0.025 eV) react with $^6$Li to generate charged particles that are detected directly within the crystal. This is the advantage of having the neutron absorber within the bulk of the semiconductor. Detection in the semiconductor mode results in the direct conversion of ionizing radiation to electrical energy, while as a scintillator, light emitted due to gamma absorption can be collected with a Si Avalanche Photodiode (APD), Si Photomultiplier (SiPM), or some other high-band gap photodetector 54.

While many systems purport the combination of a neutron detector and gamma ray detector within a variety of small architectures, this is the first embodiment which combines the advantages of a compound semiconductor neutron detector (i.e., the neutron absorbing media being contained regularly within the stoichiometry of a molecular solid crystal) and a gamma-ray scintillation crystal backed directly by a matched solid state photodetector. Others have embodied a gas detector, combined a neutron scintillation crystal with a semiconductor for charge collection, or applied neutron absorbing materials to the surface of a semiconductor crystal, or used one detector sensitive to both neutrons and gammas and a pulse shape discrimination technique. These others all have the disadvantages of either cost, power, size, or particle discrimination. Similarly, gamma ray detectors have been embodied, which are either semiconductor crystals or scintillator crystals that collect charge with a photomultiplier tube or a semiconductor photodetector.

The primary application of such a solid-state combined thermal neutron/gamma detector in the present disclosure is passive, non-contact detection of nuclear materials. All fissile material can be detected by neutron emission—either spontaneous or stimulated. Unlike low-energy gamma rays, neutrons are relatively difficult to shield, requiring appreciable volumes and thicknesses of low-Z materials (hydrogen containing, scattering) or neutron-absorbing (lithium or boron) materials. Weapons grade plutonium emits sufficient neutrons as a result of spontaneous fission to be directly (i.e., passively) detected at distances of several meters. Enriched uranium ($^{235}$U) can be detected by interrogating the material with a low energy neutron source to induce fission within the material (i.e., active detection). Active detection also is possible with both prompt ("source on") neutrons and delayed ("source off") neutrons. In addition to $^{235}$U, both $^{238}$U and $^{232}$Th may be detected using a more energetic (i.e., several MeV) neutron source to induce fissions and their time-correlated neutrons. Finally, non-fissile nuclear materials—such as lithium deuteride or possibly beryllium—may be detectable by active detection using neutrons because these materials attenuate the incident neutron beam. The feasibility of the detection of nuclear warheads using neutrons has been analyzed by U.S. and Russian researchers.

Figure 5:
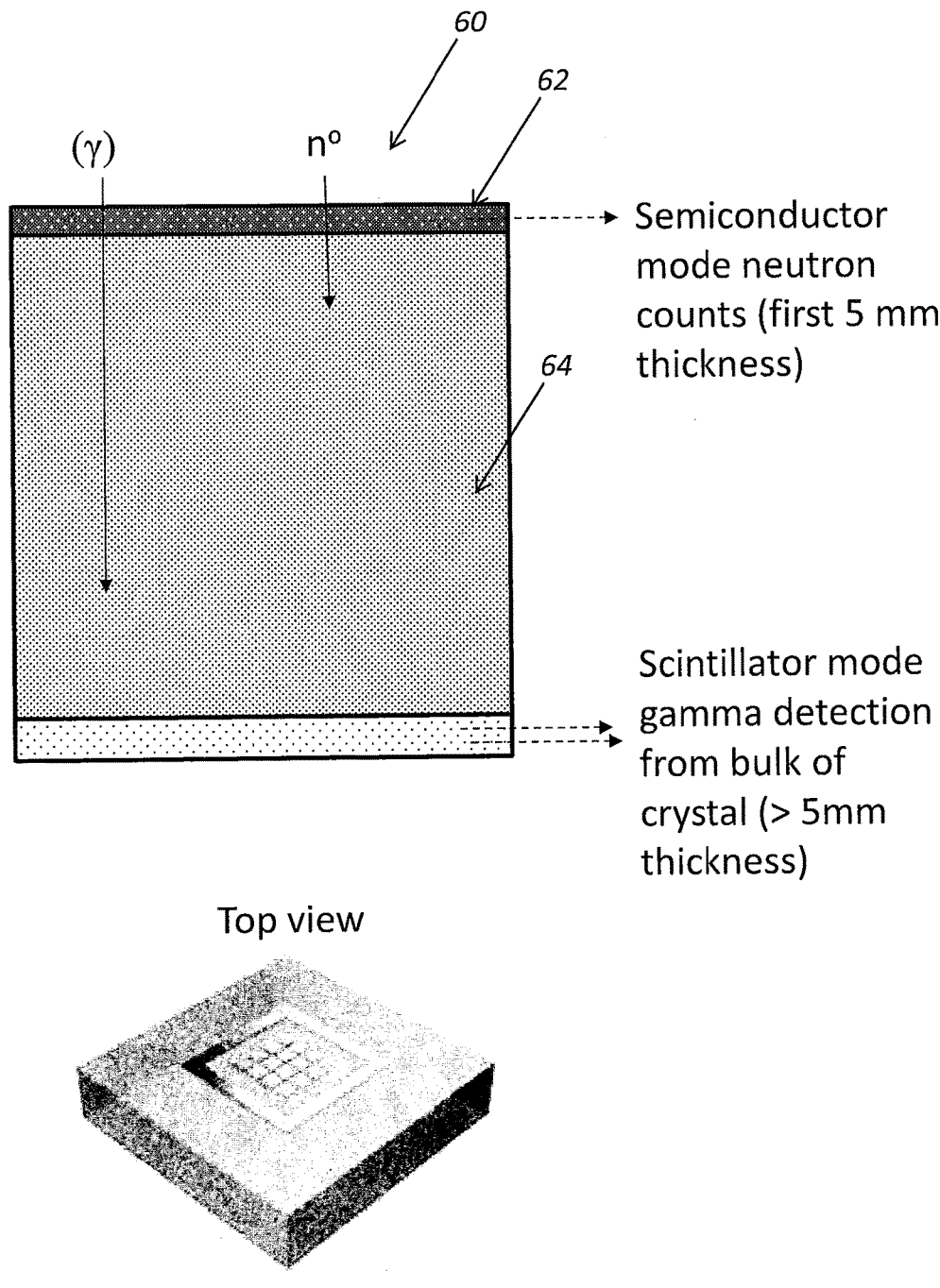
FIG. 5 is a schematic diagram illustrating another exemplary embodiment of the thermal neutron detector and gamma-ray spectrometer of the present disclosure wherein an electrical contact is coupled adjacent to or fabricated on the front crystal surface in a grid or mesh pattern with multiple areas exposed, thereby allowing slow neutrons to be collected in the initial 5 mm (the thermal neutron absorption depth) and the gamma rays to pass through the multiple exposed areas deeper into the bulk crystalline detection medium for current generation and detection.

Referring now specifically to FIG. 5, in another exemplary embodiment of the thermal neutron detector and gamma-ray spectrometer 60 of the present disclosure, an electrical contact 62 is coupled adjacent to or fabricated on the front crystal surface (e.g., by radio frequency sputtering) in a grid or mesh pattern (e.g., by photolithography) with predetermined areas exposed, thereby allowing slow neutrons to be collected in the initial 5 mm (the thermal neutron absorption depth) and the gamma rays to pass through the predetermined exposed areas deeper into the bulk crystalline detection medium 64 for current generation and detection. The grid or mesh pattern may be any suitable pattern, provided that gaps are formed, thereby allowing the neutrons to directly contact the font crystal surface and penetrate into the crystal 64. These gaps may have any surface area, which may or may not be consistent.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A combined thermal neutron detector and gamma-ray spectrometer system, comprising:
    a detection medium comprising a lithium chalcopyrite crystal operable for detecting thermal neutrons in a semiconductor mode and gamma-rays in a scintillator mode; and
    a photodetector coupled to the detection medium also operable for detecting the gamma rays.

2. The system of claim 1, wherein the detection medium comprises a $^6$LiInSe$_2$ crystal.

3. The system of claim 1, wherein the photodetector comprises one of a Si Avalanche Photodiode (APD) and a Si Photomultiplier (SiPM).

4. The system of claim 1, further comprising a bias voltage source coupled to the detection medium.

5. The system of claim 1, further comprising a plurality of contacts coupled to the detection medium.

6. The system of claim 1, further comprising an amplification system.

7. The system of claim 1, further comprising a data collection and processing device.

8. The system of claim 1, wherein the detection medium comprises a I-III-VI$_2$ compound formed by the process of:
melting a Group III element;
subsequently adding a Group I element to the melted Group III element at a rate that allows the Group I and Group III elements to react thereby providing a single phase I-III compound; and
subsequently adding a Group VI element to the single phase I-III compound and heating;
wherein the Group I element comprises lithium.

9. A combined thermal neutron detector and gamma-ray spectrometer method, comprising:
providing a detection medium comprising a lithium chalcopyrite crystal operable for detecting thermal neutrons in a semiconductor mode and gamma-rays in a scintillator mode; and
providing a photodetector coupled to the detection medium also operable for detecting the gamma rays.

10. The method of claim 9, wherein the detection medium comprises a $^6$LiInSe$_2$ crystal.

11. The method of claim 9, wherein the photodetector comprises one of a Si Avalanche Photodiode (APD) and a Si Photomultiplier (SiPM).

12. The method of claim 9, further comprising providing a bias voltage source coupled to the detection medium.

13. The method of claim 10, further comprising providing a plurality of contacts coupled to the detection medium.

14. The method of claim 9, further comprising providing an amplification system.

15. The method of claim 10, further comprising a data collection and processing device.

16. The method of claim 9, wherein the detection medium comprises a I-III-VI$_2$ compound formed by the process of:
melting a Group III element;
subsequently adding a Group I element to the melted Group III element at a rate that allows the Group I and Group III elements to react thereby providing a single phase I-III compound; and
subsequently adding a Group VI element to the single phase I-III compound and heating;
wherein the Group I element comprises lithium.

17. A combined thermal neutron detector and gamma-ray spectrometer system, comprising:
a detection medium comprising a lithium chalcopyrite crystal operable for detecting thermal neutrons in a semiconductor mode and gamma-rays in a scintillator mode;
an electrical contact disposed adjacent to an initial surface of the detection medium operable for detecting the thermal neutrons in an initial layer of the detection medium; and
a photodetector coupled to a subsequent surface of the detection medium operable for detecting the gamma rays in a subsequent layer of the detection medium.

18. The system of claim 17, wherein the detection medium comprises a $^6$LiInSe$_2$ crystal.

19. The system of claim 17, wherein the photodetector comprises one of a Si Avalanche Photodiode (APD) and a Si Photomultiplier (SiPM).

20. The system of claim 17, wherein the electrical contact utilizes a grid pattern defining a plurality of gaps.

21. The system of claim 17, wherein the initial layer comprises the initial 5 mm of the detection medium and the subsequent layer comprises the remainder of the detection medium.

* * * * *